US008525538B2

(12) United States Patent
Kim et al.

(10) Patent No.: US 8,525,538 B2
(45) Date of Patent: Sep. 3, 2013

(54) APPARATUS AND METHOD FOR TESTING A SEMICONDUCTOR DEVICE

(75) Inventors: Yanggi Kim, Hwaseong-si (KR); Chang-Hyun Cho, Hwaseong-si (KR); HoonJung Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 369 days.

(21) Appl. No.: 12/710,650

(22) Filed: Feb. 23, 2010

(65) Prior Publication Data

US 2010/0225345 A1 Sep. 9, 2010

(30) Foreign Application Priority Data

Mar. 9, 2009 (KR) .................. 10-2009-0019951

(51) Int. Cl.
*G01R 31/00* (2006.01)
(52) U.S. Cl.
USPC ............ 324/756.03; 324/754.11; 324/762.05; 324/756.01
(58) Field of Classification Search
USPC ............ 324/750.15, 750.16, 750.19, 750.22, 324/756.03, 754.11, 762.05, 756.01
See application file for complete search history.

(56) References Cited

U.S. PATENT DOCUMENTS

| 5,410,259 | A | * | 4/1995 | Fujihara et al. .......... 324/750.23 |
| 5,672,977 | A | * | 9/1997 | Yamada .................... 324/754.14 |
| 7,262,611 | B2 | * | 8/2007 | Mathieu et al. .......... 324/750.16 |
| 7,750,622 | B2 | * | 7/2010 | Strom ....................... 324/762.01 |
| 2011/0156735 | A1 | * | 6/2011 | Breinlinger et al. ..... 324/750.19 |

FOREIGN PATENT DOCUMENTS

| JP | 09-043276 | | 2/1997 |
| JP | 09043276 | A * | 2/1997 |
| JP | 2007-116085 | | 5/2007 |
| JP | 2007-132846 | | 5/2007 |
| JP | 2007116085 | A * | 5/2007 |
| KR | 1020000068145 | | 11/2000 |

OTHER PUBLICATIONS

JP_09-043276A_Machine translation, translated Apr. 5, 2012.*
JP_2007-116085A_Machine translation, translated Apr. 5, 2012.*

* cited by examiner

*Primary Examiner* — Arleen M Vazquez
(74) *Attorney, Agent, or Firm* — F. Chau & Associates, LLC (57) ABSTRACT

Provided are an apparatus and a method of testing a semiconductor device. A horizontal maintaining unit provided inside a test head applies load to a probe card in a direction perpendicular to the probe card to hold the probe card in a horizontal state.
Probe needles of the probe card are uniformly placed on a central region of pads of the semiconductor device, thereby providing an apparatus and a method of testing a semiconductor device capable of improving productivity and reducing a yield loss of a test process.

20 Claims, 11 Drawing Sheets

APPARATUS AND METHOD FOR TESTING A SEMICONDUCTOR DEVICE

CROSS-REFERENCE TO RELATED APPLICATIONS

This U.S. patent application claims priority under 35 U.S.C. §119 to Korean Patent Application No. 10-2009-0019951, filed on Mar. 9, 2009, the disclosure of which is hereby incorporated by reference herein in it's entirety.

BACKGROUND OF THE INVENTIVE CONCEPT (i) Technical Field

The present disclosure herein relates to an apparatus and to a method of testing a semiconductor device, and more particularly, to an apparatus and to a method of testing an electrical characteristic of a semiconductor device.

(ii) Description of the Related Art

Generally, a semiconductor manufacturing process includes a fabrication process forming various semiconductor device on a wafer, an electric die sorting (EDS) process testing an electrical characteristic of a device formed on a wafer and an assembly process packing a device to protect a device from external mechanical, physical and chemical shocks after dividing good devices determined by the EDS process into each one.

The EDS process is a process which may reduce the time and the cost required in an assembly process and a package test by repairing a faulty semiconductor device, removing a semiconductor device that may not be repaired and removing a faulty cause by analyzing the faulty cause.

The EDS process may be comprised of, for example, a burn-in process, a pre-laser process, a laser repair process and a post-laser process. The burn-in process is a process in which after applying an excess stress to a plurality of semiconductor devices formed on a wafer, a semiconductor device that may not endure a stress may be removed early. The pre-laser process is a process in which after testing whether a semiconductor device is good or not by applying a specific current to a semiconductor device, the location of a faulty semiconductor device may be addressed. The laser repair process is a process in which a laser beam may be shot to a faulty semiconductor device on the basis of data obtained from the pre-laser process to repair a semiconductor device. The post-laser process may be used as a process for testing whether the repaired semiconductor device is operated normally or not.

SUMMARY OF THE INVENTIVE CONCEPT

Embodiments of the inventive concept provide a test apparatus of testing an electrical characteristic of a semiconductor device. The test apparatus may include a substrate support unit on which a substrate with the semiconductor device formed thereon is placed, a test head including a base to which a probe card is connected, and wherein the test head is provided above the substrate support unit. The test apparatus further includes a horizontal maintaining unit holding the probe card in a horizontal state by applying a load on the probe card, and the horizontal maintaining unit is installed inside the base of the test head.

In one embodiment, the horizontal maintaining unit may include a chucking member chucking a reinforcement member combined with a top surface of the probe card and a linear driving member linearly moving the chucking member in a direction perpendicular to the top surface of the probe card.

In one embodiment, the reinforcement member may include a first reinforcement member combined with an edge region of the top surface of the probe card and a second reinforcement member disposed above a central region of the probe card so that a separation space between the second reinforcement member and the probe card is formed, the second reinforcement member having an opening on a central region thereof, the second reinforcement member being connected to the first reinforcement member, and wherein the chucking member is inserted into the opening of the second reinforcement member to chuck the second reinforcement member.

In one embodiment, the chuck member may include a chuck including a rotational shaft disposed in a direction perpendicular to the top surface of the probe card, and an upper plate and a lower plate horizontally installed on the rotational shaft to be parallel to each other and a rotation driver rotating the chuck with reference to the rotational shaft, and wherein the chuck is inserted into the opening of the second reinforcement member so that the second reinforcement member is located between the upper and lower plates and the chuck is rotated by the rotation driver to chuck the second reinforcement member.

In one embodiment, the lower plate and the opening may have the same outer shape.

In one embodiment, the lower plate may have a polygonal shape.

In one embodiment, the lower plate may have an oval shape.

In one embodiment, the test apparatus may further include a photographing member photographing the pads on which a contact mark is formed by a physical contact between probe needles of the probe card and pads of the semiconductor device and a controller controlling an operation of the linear driving member by determining an image of the pad which the photographing member photographs and by determining whether a bending of the probe card is generated or not according to a location of the contact mark on the pads.

Embodiments of the inventive concept also provide a method of testing a semiconductor device. The method may include connecting a probe card to a test head of a testing apparatus for testing an electrical characteristic of a semiconductor device; contacting a substrate having a semiconductor device formed thereon with probe needles of the probe card; and applying a load to the probe card by a horizontal maintaining unit provided inside the test head in a direction perpendicular to the probe card to maintain horizontality of the probe card.

In one embodiment, the method may further include determining a location of a contact mark formed on pads of the semiconductor device, wherein the load is applied to the probe card in a different direction according to the location of the contact mark.

In another embodiment, a semiconductor device test apparatus is provided. The apparatus includes a probe room which includes a substrate support unit installed on a transferring member, wherein the transferring member linearly moves the substrate support unit in a horizontal direction and a vertical direction and rotates the substrate support unit and a loader room disposed adjacently to one side of the probe room. The loader room is operatively connected to the probe room for transferring a wafer having a semiconductor device formed thereon to the probe room to be placed on the substrate support unit and tested;

The apparatus further includes a probe card disposed in a hole located in an upper wall of the probe room, wherein the probe card faces the substrate support unit disposed in the probe room and includes probe needles thereon. Electrodes pads of the semiconductor device on the wafer are disposed under a vertical direction of the probes needles of the probe card such that when the support substrate unit having the wafer thereon is transferred in the vertical direction by the transferring member, the electrode pads can be in physical contact with the probe needles of the probe card thereby forming a contact mark on the electrode pads. In addition, the apparatus further includes a tester which includes a test body disposed on one side of the probe room and a test head electrically connected to the test body, the test head includes a base to which the probe card is connected, the test body applies an electrical signal for testing the semiconductor device to the probe card through the test head and the base, and then receives a signal checked from the applied electrical signal from the probe card to judge whether the semiconductor device is good or not, a horizontal maintaining unit installed inside the base of the test head for holding the probe card in a horizontal state by applying a load to the probe card in a direction opposite to the bending direction and a controller which determines the location of the contact mark and compensates for a bending of the probe card by controlling movement of a certain part of the horizontal maintaining unit.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Preferred embodiments of the inventive concept will be described below in more detail with reference to the accompanying drawings. The embodiments of the inventive concept may, however, be embodied in different forms and should not be constructed as limited to the embodiments set forth herein. Like numbers refer to like elements throughout.

(Embodiment)

Figure 1:
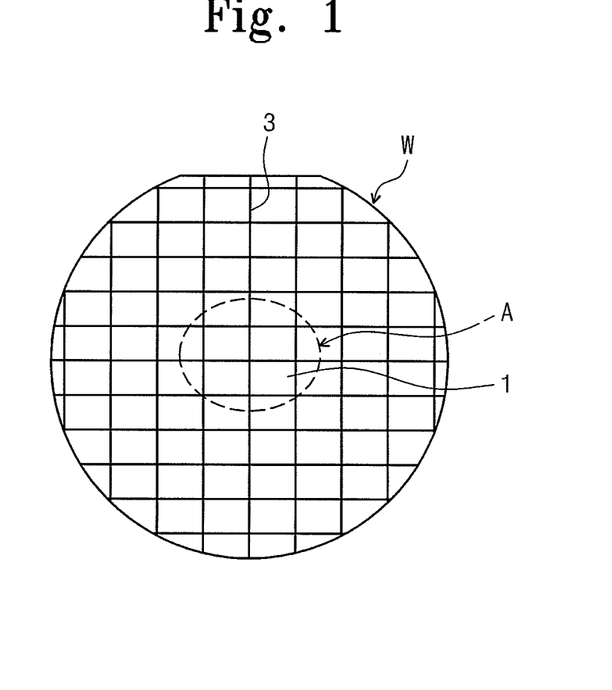
FIG. 1 is a view illustrating a wafer on which a semiconductor device is formed.
Figure 2:
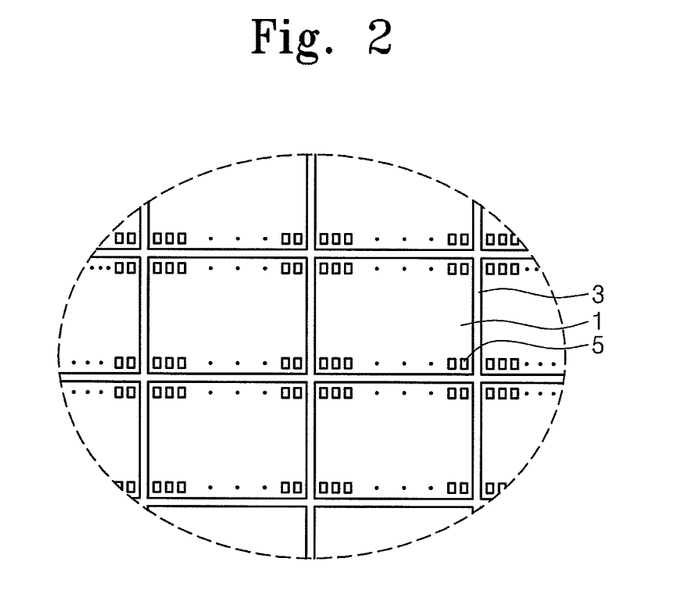
FIG. 2 is an enlarged view of "A" portion illustrated in FIG. 1.

FIG. 1 is a view illustrating a wafer in which a semiconductor device is formed. FIG. 2 is an enlarged view of "A" portion illustrated in FIG. 1.

Referring to FIGS. 1 and 2, a plurality of semiconductor devices 1 is formed on a wafer (W) through a fabrication process and the semiconductor devices 1 are divided by a scribe line 3 to be manufactured in an individual unit chip through an assembly process.

An EDS (electrical die sorting) process testing an electrical characteristic of the semiconductor devices 1 formed on the wafer (W) is performed between a fabrication process and an assembly process. The EDS process is a process in which an electrical signal is applied to electrode pads 5 provided along a peripheral portion of the semiconductor devices 1 formed on the wafer (W) to judge whether the semiconductor devices 1 are good or not by a signal checked from the applied electrical signal.

Hereinafter, a semiconductor device test apparatus in accordance with the inventive concept used in performing the EDS process is described.

Figure 3:
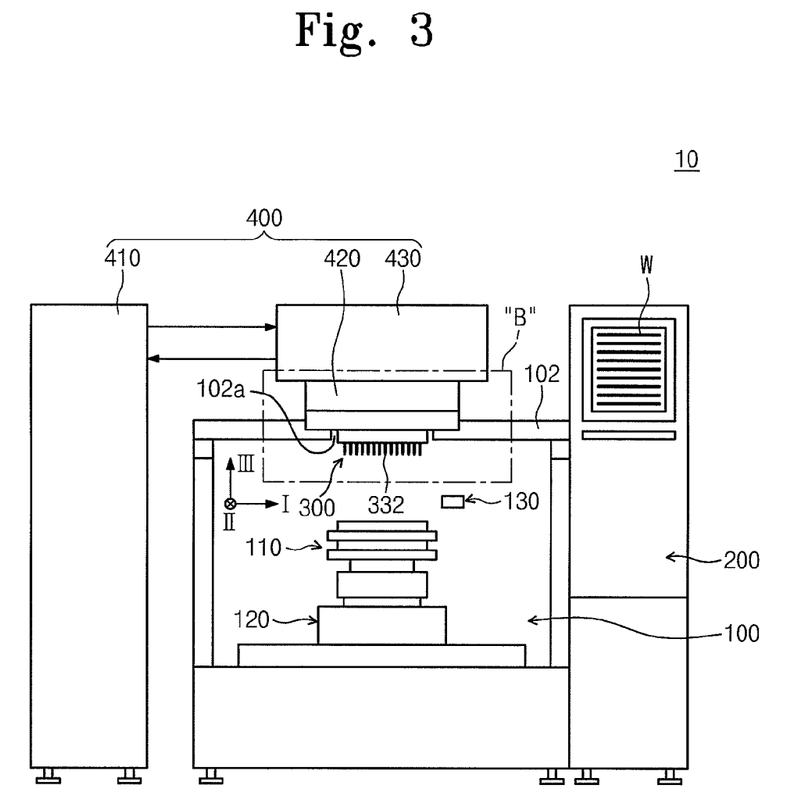
FIG. 3 is a view illustrating a semiconductor device test apparatus in accordance with the inventive concept.

FIG. 3 is a view illustrating a semiconductor device test apparatus in accordance with the inventive concept. Referring to FIG. 3, a semiconductor device test apparatus 10 includes a probe room 100, a load room 200, a probe card 300 and a tester 400.

The probe room 100 provides a space in which an EDS process testing an electrical characteristic of a semiconductor device is performed. A loader room 200 is disposed to be adjacent to one side of the probe room 100. The loader room 200 receives a wafer (W) to be tested and transfers the wafer (W) to the probe room 100.

A probe card 300 is placed on a hole 102a formed in an upper wall 102 of the probe room 100. A substrate support unit 110 is disposed inside the probe room 100 to face the probe card 300. A wafer transferred from the loader room 200 is placed on the substrate support unit 110.

The substrate support unit 110 is installed on a transferring member 120. The transferring member 120 linearly moves the substrate support unit 110 in a horizontal direction (I, II) and a vertical direction (III) and rotates the substrate support unit 110 using a self central axis perpendicular to a plane of a wafer as a rotating axis. Here, the horizontal axis (I, II) is a direction that semiconductor device is arranged on a plane of a wafer and the vertical direction (III) is a direction perpendicular to a plane of a wafer.

As the substrate support unit 110 is rotated by the transferring member 120, the arrangement direction of electrode pads of a semiconductor device formed on a wafer is arranged in the arrangement direction of probe needles 332 of the probe card 300.

As the substrate support unit 110 is transferred in the horizontal direction (I, II) by transferring member 120, electrode pads of a semiconductor device formed on a wafer are arranged under a vertical direction of the probes needles 332 of the probe card 300.

As the substrate support unit 110 is linearly transferred in the vertical direction (III) by transferring member 120, electrode pads of a semiconductor device formed on a wafer can be physically in contact with the probes needles 332 of the probe card 300.

A contact mark is formed on the pad by physical contact between the probe needles 332 and the pads. The contact mark may be formed in the center of the pad and a photographing member 130 such as, for example, a direct probe sensor (DPS) may be used to confirm a location of the contact mark. The photographing member 130 may be provided to one side of the substrate support unit 110 and the photographing member 130 takes a picture of a surface of the pad to obtain image data of the pad. The image data is transferred to a control portion (not illustrated) to be used in judging whether the contact mark is formed in a wanted location or not.

A tester 400 includes a test body 410 disposed in one side of the probe room 100 and a test head 430 electrically connected to the test body 410. The test head 430 includes a base 420 to which the probe card 300 is connected. The test body 410 applies an electrical signal for testing a semiconductor device to the probe card 300 through the test head 430 and the base 420, and then receives a signal checked from the applied electrical signal from the probe card 300 to judge whether a semiconductor device is good or not.

Figure 4:
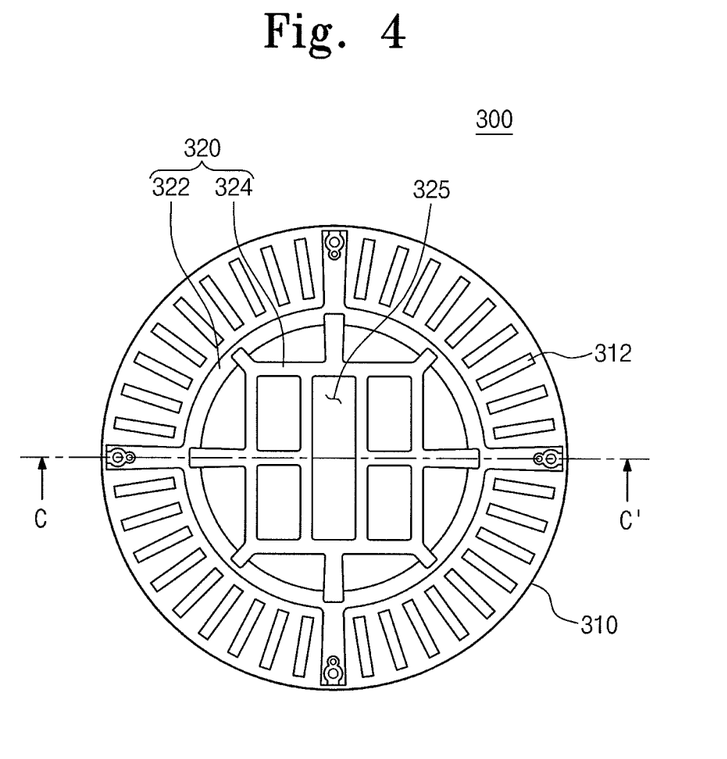
FIG. 4 is a top plan view of a probe card illustrated in FIG. 3.
Figure 5:
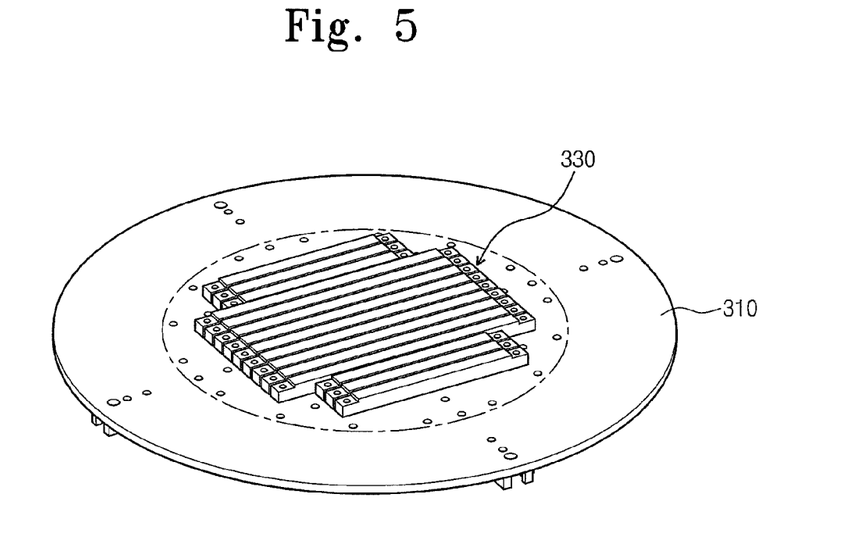
FIG. 5 is a perspective view illustrating a bottom surface of the probe card of FIG. 3.
Figure 6:
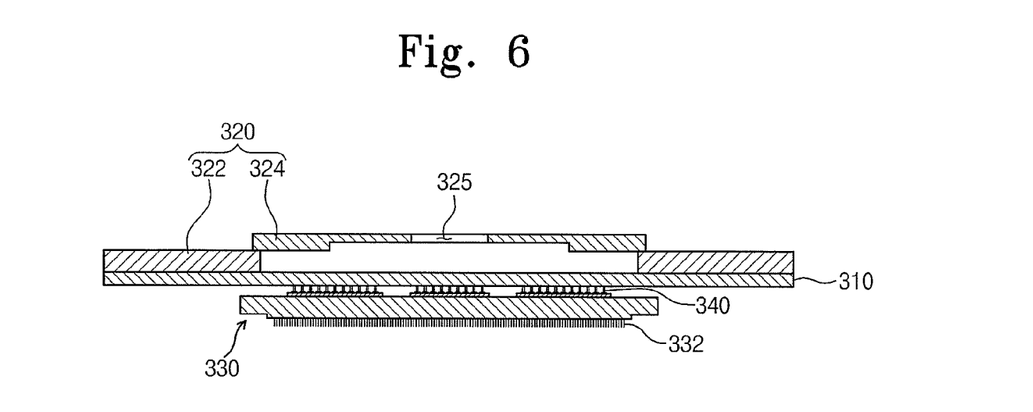
FIG. 6 is a cross sectional view taken along the line C-C' of FIG. 4.

FIG. 4 is a top plan view of a probe card illustrated in FIG. 3. FIG. 5 is a perspective view illustrating a bottom surface of the probe card of FIG. 3. FIG. 6 is a cross sectional view taken along the line C-C' of FIG. 4.

Referring to FIGS. 4 through 6, the probe card 300 has a main circuit board 310 of a round shape. A reinforcement member 320 for preventing deformation of the main circuit board 310 such as, for example, a bending or a twisting is installed on a top surface of the main circuit board 310. Connectors 312 are disposed on an edge region of the top surface of the main circuit board 310 along a circumference direction. Probe blocks 330 of a bar shape capable of accommodating rows and columns that semiconductor devices constitute in a wafer are installed on a bottom surface of the main circuit board 310. The probe blocks 330 are connected to the main circuit board 310 by an interposer 340. Probe needles 332 which are physically in contact with electrode pads of a semiconductor device to be tested are combined with a bottom surface of the probe blocks 330.

The reinforcement member 320 includes a first reinforcement member 322 and a second reinforcement member 324. The first reinforcement member 322 has a ring shape and is located inside an arrangement of the connectors 312. The second reinforcement member 324 is disposed above a central region of the main circuit board 310 so that a separation space between the main circuit board 310 and the second reinforcement member 324 is formed and is connected to the first reinforcement member 322. An opening 325 is formed on the central region of the second reinforcement member 324.

Figure 7:
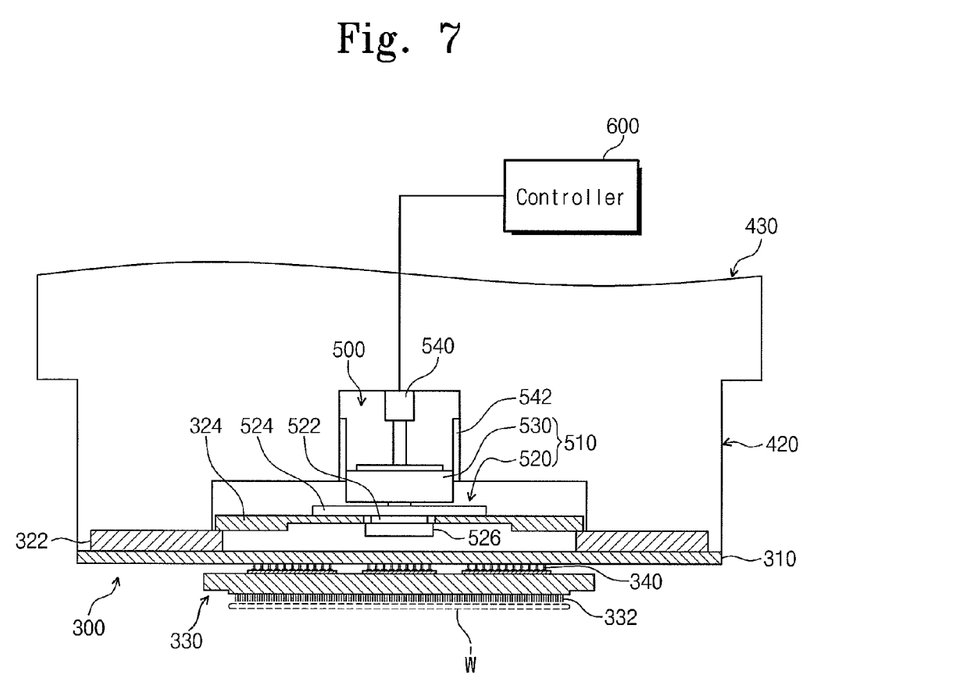
FIG. 7 is an enlarged view of "B" of FIG. 3.
Figure 8:
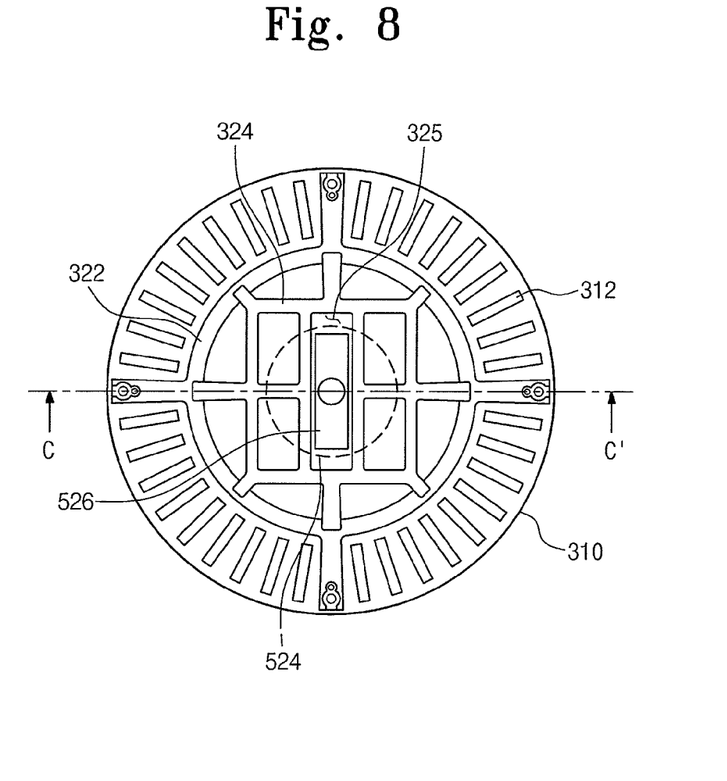
FIG. 8 is a top plan view of a probe card and a chuck illustrated in FIG. 7.
Figure 9:
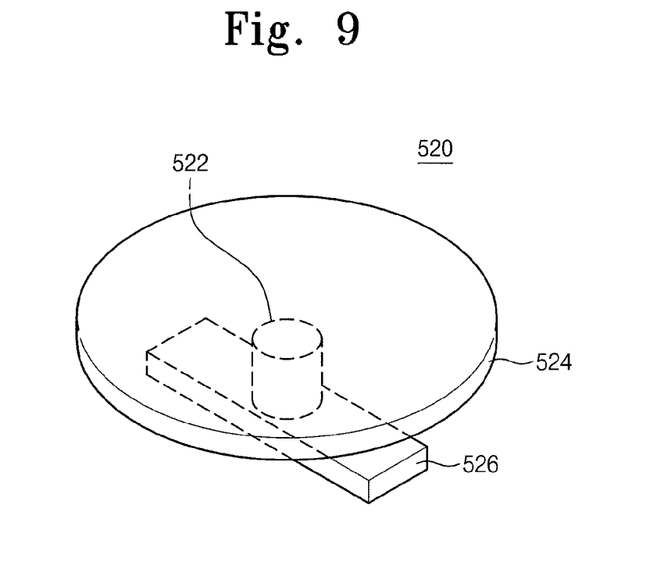
FIG. 9 is a perspective view of the chuck illustrated in FIG. 7.

FIG. 7 is an enlarged view of "B" of FIG. 3. FIG. 8 is a top plan view of a probe card and a chuck illustrated in FIG. 7. FIG. 9 is a perspective view of the chuck illustrated in FIG. 7.

Referring to FIGS. 7 through 9, a base 420 has a cask shape that a bottom of the base 420 is open. Connectors (not illustrated) are provided in a bottom surface of the base 420. The connectors (not illustrated) of the base 420 and the connectors (not illustrated) of the probe card 300 form one pair bond. The probe card 300 may be combined with the base 420 so that the open bottom of the base 420 is closed. At this time, the connectors (not illustrated) of the probe card 300 are combined with the connectors (not illustrated) of the base 420.

Under the condition that the probe card 300 is combined with the base 420 of the test head 430, the substrate support unit 110 is moved to the probe card 300 by the transferring member 120. Then, an EDS process testing an electrical characteristic of a device may be performed when electrode pads of a device formed on the wafer (W) placed on the substrate support unit 110 are in contact with the probe needles 332 of the probe card 300.

In the EDS process, a wafer may be tested under the condition that a temperature is changed from, for example, about −20° C. to about 90° C. This is because when a device is tested under a low temperature state and a high temperature state, reliability of a device operation may be significantly improved.

However, as a wafer size becomes large, a probe card size may also become large, so that bending of a probe card may occur when a test is performed under a low temperature and a high temperature. When performing a test under a low temperature, the probe card may be bent to have an upwardly convex shape and when performing a test under a high temperature, the probe card may be bent to have a downwardly convex shape. In this case, contact locations of probe needles with respect to electrode pads of a wafer may be changed. If contact locations of probe needles are changed, a yield loss may occur and productivity may be lowered by a process failure that erroneously determines that good chips have failed.

The inventive concept provides a horizontal maintaining unit 500 for holding a probe card in a horizontal state to solve the difficultly described above. The horizontal maintaining unit 500 is installed inside the base 420 of the test head 430 and can hold the probe card 300 in a horizontal state by applying a load to the probe card 300 in a direction opposite to a bending direction.

The horizontal maintaining unit 500 includes a chucking member 510 chucking the second reinforcement member 324 and a linear driving member 540 linearly moving the chucking member 510 in a direction opposite to a bending direction of the main circuit board 310.

Figure 10:
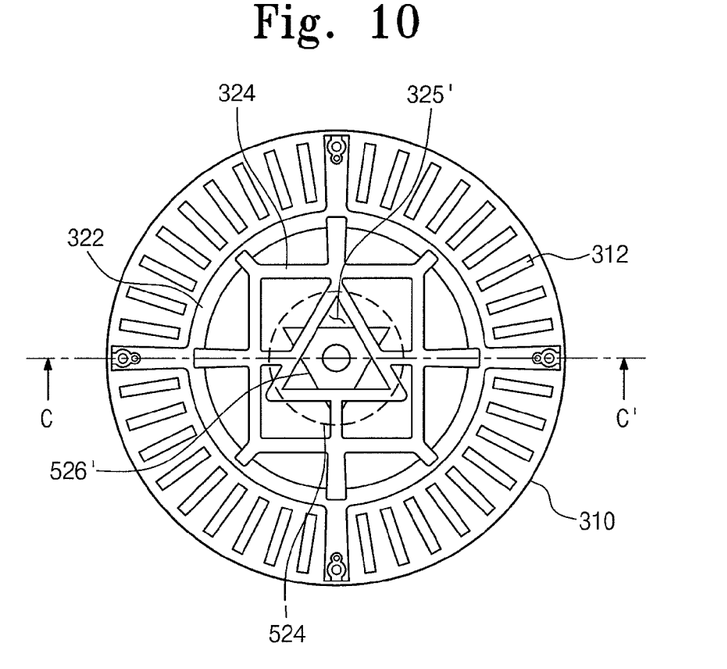
FIGS. 10 and 11 are views illustrating other examples of a chuck.
Figure 11:
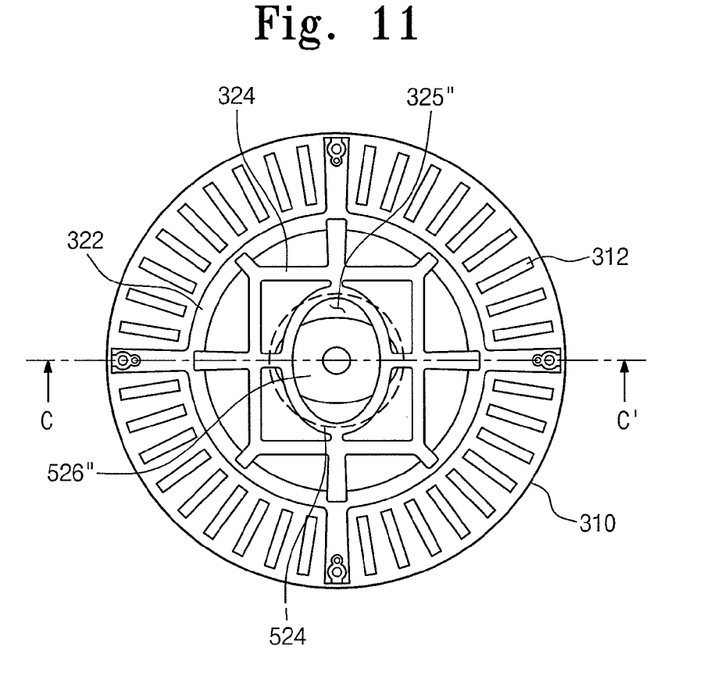

The chucking member 510 includes a chuck 520 and a rotation driver 530. The chuck 520 includes a rotational shaft 522 provided in a direction perpendicular to the main circuit board 310. An upper plate 524 and a lower plate 526 are horizontally installed on both sides of the rotational shaft 522 to be parallel to each other. As illustrated in FIG. 9, the upper plate 524 may be a plate of, for example, a round shape and the lower plate 526 may be a plate of, for example, a square shape. Besides, as illustrated in FIG. 10, the lower plate 526' may be a plate of, for example, a triangle shape and as illustrated in FIG. 11, the lower plate 526" may be a plate of, for example, an oval shape. The lower plate may be a plate of, for example, a polygonal shape.

The chuck 520 may be inserted in the openings 325 formed on the second reinforcement member 324 so that the upper plate 524 is disposed above the second reinforcement member 324 and the lower plate 526 is disposed below the reinforcement member 324. The opening 325 may be provided to have, for example, a square shape identical to a shape of the lower plate 526 so that the lower plate 526 of the chuck 520 passes through the opening 325. Consequently, the lower plate 526 has the same lengthwise direction as the opening 325. Meanwhile, for example, if the lower plate 526' has a triangle shape as illustrated in FIG. 10, the opening 325' may have a triangle shape and if the lower plate 526" has an oval shape as illustrated in FIG. 11, the opening 325" may have an oval shape.

Figure 12:
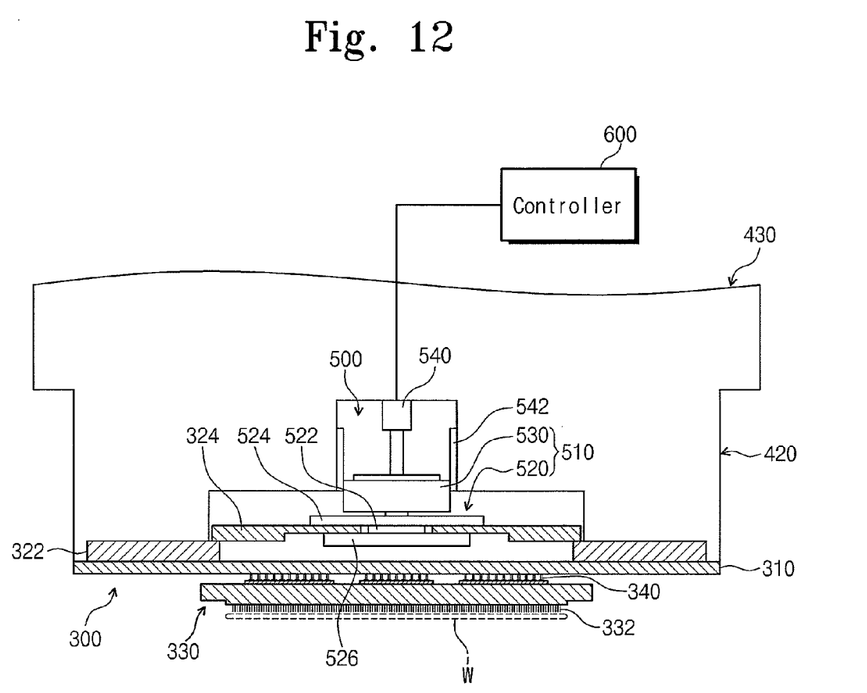
FIG. 12 is a view illustrating a state that a lower plate of FIG. 7 is rotated.
Figure 13:
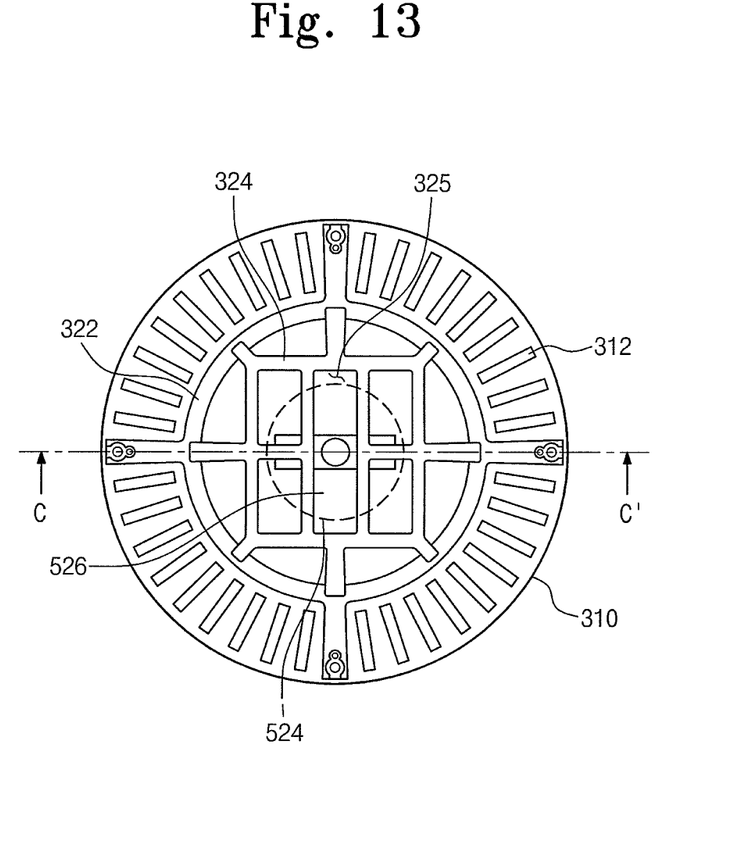
FIG. 13 is a view illustrating a state that a lower plate of FIG. 8 is rotated.

The rotation driver 530 may be connected to the upper plate 524 and rotates the chuck 520 using the rotational shaft 522 as the axis of a rotation. For example, the rotation driver 530 may, as illustrated in FIGS. 12 and 13, rotate the chuck 520 so that a lengthwise direction of the lower plate 526 is perpendicular to a lengthwise direction of the opening 325. When the chuck 520 rotates, the upper plate 524 and the lower plate 526 chuck the second reinforcement member 324.

The linear driving member 540 may be comprised of, for example, an air pressure cylinder or an oil pressure cylinder and provide a driving force so that the rotation driver 530 and the chuck 520 move in an upward and downward direction.

The rotation driver 530 can be vertically moved by a guide member 542 installed on the base 420. The operation of the linear driving member 540 is controlled by controller 600.

Figure 14:
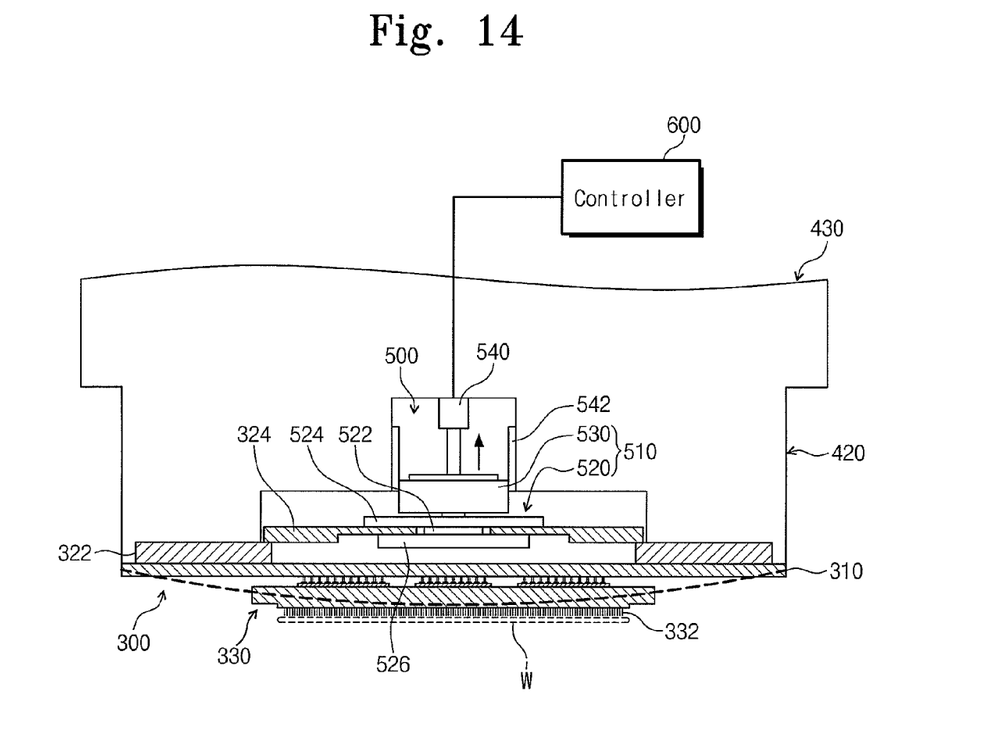
FIGS. 14 and 15 are views illustrating an operation state of a horizontal maintaining unit.
Figure 15:
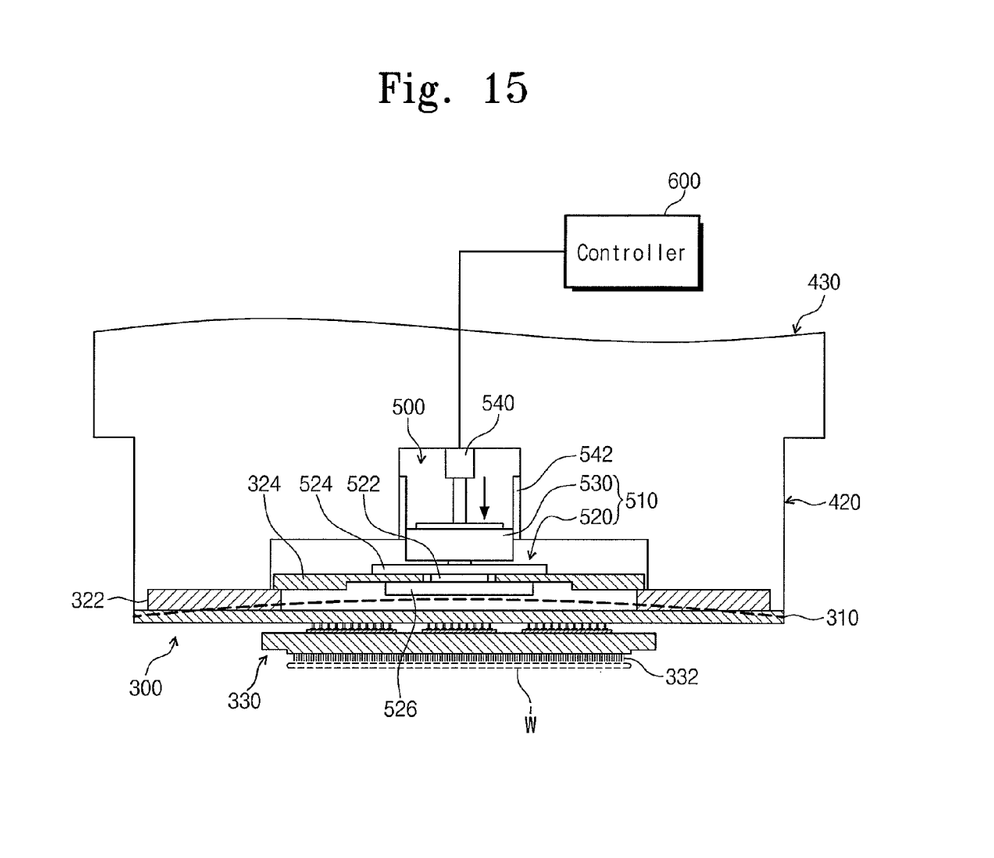

FIGS. 14 and 15 are views illustrating an operation state of a horizontal holding unit.

FIGS. 3, 14 and 15, a wafer to be tested is placed on the substrate support unit 110 and the transferring member 120 performs a wafer arrangement so that pads formed on a semiconductor device are located in a place corresponding to the probes needles 332.

After that, pads of the semiconductor devices are in contact with the probe needles 332 by raising the substrate support unit 110 and an EDS process testing electrical characteristics of semiconductor devices is performed by applying electrical signals to the device pads through the probe needles 332. As a result of the EDS process, a contact mark is formed at a position that the probe needles 332 are in contact with a pad surface.

When an EDS process is finished, pad surfaces on which a contact mark is formed are photographed using the photographing member 130 to obtain image data of the pads. The image data of the pads are transferred to the controller 600 and the controller 600 determines whether the contact marks are formed in a central region of the inside of the pads or not.

As a result of the determination, if the contact marks are formed at standard locations, a subsequent process is performed. However, as a result of the determination, if the contact marks are formed to miss the standard locations, the controller 600 drives the linear driving member 540 to vertically move the chuck 520 chucking the second reinforcement member 324 so as to compensate for the bending of the probe card.

For example, as a result of the determination of the pad image, as illustrated in FIG. 14, if it is determined that the probe card is bent in a downwardly convex direction, the controller 600 drives the linear driving member 540 to upwardly move the chuck 520. When the chuck 520 upwardly moves, the load acts on the probe card along the moving direction of the chuck 520 to compensate for the bending of the probe card.

For example, as a result of determination of the pad image, as illustrated in FIG. 15, if it is determined that the probe card is bent in a upwardly convex direction, the control portion 600 drives the linear driving member 540 to downwardly move the chuck 520. When the chuck 520 downwardly moves, the load acts on the probe card along the moving direction of the chuck 520 to compensate for the bending of the probe card.

In this manner, when the compensation for the bending of a probe card is completed, a new wafer to be tested is placed on the substrate support unit 110, and then a wafer arrangement, an EDS process and a contact mark determination are sequentially performed. According to the results of the determination of the contact mark, the bending of the probe card is compensated and the process described above is repeatedly performed on a new wafer.

According to the inventive concept, the bending of a probe card may be minimized.

According to the inventive concept, the location in which the probe needles of a probe card are in contact with pads of a semiconductor device may be uniformly held in a central region inside the pad.

Also, according to the inventive concept, a yield loss of a test process of a semiconductor device may be reduced and productivity may be improved.

Having described the exemplary embodiments of the inventive concept, it is further noted that it is readily apparent to those of reasonable skill in the art that various modifications may be made without departing from the spirit and scope of the inventive concept which defined by the metes and bounds of the appended claims.

What is claimed is:

1. A test apparatus for testing an electrical characteristic of a semiconductor device comprising:
    a substrate support unit on which a substrate with the semiconductor device formed thereon is placed;
    a test head including a base to which a probe card is connected, the test head being provided above the substrate support unit;
    a horizontal maintaining unit holding the probe card in a horizontal state by applying a load on the probe card, the horizontal maintaining unit being installed inside the base of the test head; and
    a reinforcement member combined with a top surface of the probe card, wherein the reinforcement member comprises:
    a first reinforcement member disposed on a portion of the top surface of the probe card, and
    a second reinforcement member which is connected to the first reinforcement member and disposed above a central region of the probe card and disposed on a portion of a top surface of the first reinforcement member so that a separation space confined in between the second reinforcement member, the first reinforcement member, and the probe card is formed; and
    a controller which determines the location of the contact mark and compensates for a bending of the probe card by controlling movement of a certain part of the horizontal maintaining unit.

2. The test apparatus of claim 1, wherein the horizontal maintaining unit comprises:
    a chucking member chucking the reinforcement member combined with the top surface of the probe card; and
    a linear driving member linearly moving the chucking member in a direction perpendicular to the top surface of the probe card.

3. The test apparatus of claim 2, wherein the second reinforcement member having an opening on a central region thereof, wherein the chucking member is insertable into the opening of the second reinforcement member to chuck the second reinforcement member.

4. The test apparatus of claim 3, wherein the chucking member comprises:
    a chuck including a rotational shaft disposed in a direction perpendicular to the top surface of the probe card, and an upper plate and a lower plate horizontally installed on the rotational shaft and disposed parallel to each other; and
    a rotation driver rotating the chuck with reference to the rotational shaft,
    wherein the chuck is insertable into the opening of the second reinforcement member so that the second reinforcement member is located between the upper plate and the lower plate and the chuck is rotated by the rotation driver to chuck the second reinforcement member.

5. The test apparatus of claim 4, wherein the lower plate and the opening have substantially the same outer shape.

6. The test apparatus of claim 5, wherein the lower plate has a polygonal shape.

7. The test apparatus of claim 5, the lower plate has an oval shape.

8. The test apparatus of claim 4, wherein the upper plate of the chuck is disposed directly on a top surface of the second reinforcement member and wherein the lower plate of the chuck is disposed in the separation space which is confined directly in between the second reinforcement member, the first reinforcement member and the probe card.

9. The test apparatus of claim 2, further comprising:
a photographing member which photographs the pads on which a contact mark is formed, wherein the contact mark is formed by physical contact between the probe needles of the probe card and pads of the semiconductor device, and
wherein the controller controls an operation of the linear driving member by determining an image of the pad which the photographing member photographs and by determining whether the bending of the probe card is generated or not according to the location of the contact mark on the pads.

10. A method of testing an electrical characteristic of a semiconductor device comprising:
connecting a probe card to a test head of a testing apparatus for testing an electrical characteristic of a semiconductor device;
contacting a substrate having a semiconductor device formed thereon with probe needles of the probe card;
applying a load to the probe card by a horizontal maintaining unit provided inside the test head in a direction perpendicular to the probe card to maintain horizontality of the probe card; and
determining a location of a contact mark formed on pads of the semiconductor device, and compensating for a bending of the probe card by applying the load to the probe card in a different direction than a bending direction of the probe card according to the location of the contact mark.

11. A semiconductor device test apparatus comprising:
a probe room which includes a substrate support unit installed on a transferring member, wherein the transferring member linearly moves the substrate support unit in a horizontal direction and a vertical direction and rotates the substrate support unit;
a loader room disposed adjacently to one side of the probe room, the loader room is operatively connected to the probe room for transferring a wafer having a semiconductor device formed thereon to the probe room to be placed on the substrate support unit and tested;
a probe card disposed in a hole located in an upper wall of the probe room, wherein the probe card faces the substrate support unit disposed in the probe room and includes probe needles thereon, wherein electrodes pads of the semiconductor device on the wafer are disposed under a vertical direction of the probes needles of the probe card such that when the support substrate unit having the wafer thereon is transferred in the vertical direction by the transferring member, the electrode pads can be in physical contact with the probe needles of the probe card to thereby have a contact mark formed on the electrode pads;
a tester which includes a test body disposed on one side of the probe room and a test head electrically connected to the test body, the test head includes a base to which the probe card is connected, the test body applies an electrical signal for testing the semiconductor device to the probe card through the test head and the base, and then receives a signal checked from the applied electrical signal from the probe card to judge whether the semiconductor device is good or not;
a horizontal maintaining unit installed inside the base of the test head for holding the probe card in a horizontal state by applying a load to the probe card in a direction opposite to a bending direction of the probe card; and
a controller which determines the location of the contact mark and compensates for a bending of the probe card by controlling movement of a certain part of the horizontal maintaining unit.

12. The test apparatus of claim 11, further comprising a photographing member formed to one side of the substrate support unit in the probe room, wherein the photographing member takes a picture of a surface of the electrode pads of the semiconductor device to obtain image data of the electrode pads.

13. The test apparatus of claim 12, wherein the probe card has a main circuit board and a reinforcement member for preventing deformation of the main circuit board, the reinforcement member is installed on a top surface of the main circuit board and connectors are disposed on an edge region of the top surface of the main circuit board along a circumference direction.

14. The test apparatus of claim 13, further comprising probe blocks disposed on a bottom surface of the main circuit board, the probe blocks are connected to the main circuit board by an interposer, and wherein the probe needles are provided on a bottom surface of the probe blocks.

15. The test apparatus of claim 13, wherein the reinforcement member includes a first reinforcement member and a second reinforcement member, the first reinforcement member is located inside an arrangement of the connectors and in direct physical contact with a portion of the top surface of the main circuit board, the second reinforcement member is connected to the first reinforcement member and is disposed above a central region of the main circuit board and in direct physical contact with a portion of a top surface of the first reinforcement member so that a separation space confined directly in between the main circuit board, the first reinforcement member and the second reinforcement member is formed, and wherein an opening is located in a central region of the second reinforcement member.

16. The test apparatus of claim 15, wherein the horizontal maintaining unit includes a chucking member which chucks the second reinforcement member and a linear driving member which linearly moves the chucking member in a direction opposite a bending direction of the main circuit board.

17. The test apparatus of claim 16, wherein the chucking member includes a chuck and a rotation driver, wherein the chuck includes a rotational shaft provided in a direction perpendicular to the main circuit board, wherein an upper plate and a lower plate are horizontally disposed on both sides of the rotational shaft and are parallel to each other, and wherein the rotation driver is connected to the upper plate and rotates the chuck using the rotational shaft as the axis of a rotation and when the chuck rotates, the upper plate and the lower plate chuck the second reinforcement member.

18. The test apparatus of claim 17, wherein the lower plate has one of a polygonal shape or an oval shape.

19. The test apparatus of claim 17, wherein the chuck is insertable in the opening formed in the second reinforcement member so that the upper plate is disposed above the second reinforcement member and the lower plate is disposed below the reinforcement member, and wherein the opening and the lower plate have substantially the same outershape.

20. The test apparatus of claim 19, wherein the controller controls the operation of the linear driving member by determining an image of the pad which the photographing member photographs and by determining whether a bending of the probe card is generated or not according to a location of the contact mark on the pads.

* * * * *